United States Patent
Corazza et al.

(10) Patent No.: US 10,475,714 B2
(45) Date of Patent: Nov. 12, 2019

(54) LED SYSTEM

(71) Applicant: SAES GETTERS S.p.A., Lainate MI (IT)

(72) Inventors: Alessio Corazza, Como CO (IT); Calogero Sciascia, Piacenza PC (IT); Paolo Vacca, Milan MI (IT)

(73) Assignee: SAES GETTERS S.p.A., Lainate MI (IT)

( * ) Notice: Subject to any disclaimer, the term of this patent is extended or adjusted under 35 U.S.C. 154(b) by 0 days.

(21) Appl. No.: 15/998,959

(22) PCT Filed: Feb. 14, 2017

(86) PCT No.: PCT/IB2017/050812
§ 371 (c)(1),
(2) Date: Aug. 17, 2018

(87) PCT Pub. No.: WO2017/141159
PCT Pub. Date: Aug. 24, 2017

(65) Prior Publication Data
US 2019/0267521 A1    Aug. 29, 2019

(30) Foreign Application Priority Data
Feb. 19, 2016 (IT) .................. 102016000017351

(51) Int. Cl.
| | | |
|---|---|---|
| *H01L 23/26* | (2006.01) | |
| *H01L 33/56* | (2010.01) | |
| *B01J 20/18* | (2006.01) | |
| *B01J 20/28* | (2006.01) | |
| *B01J 20/04* | (2006.01) | |
| *B01J 20/06* | (2006.01) | |
| *H01L 51/52* | (2006.01) | |
| *H01L 31/18* | (2006.01) | |

(52) U.S. Cl.
CPC ............ *H01L 23/26* (2013.01); *B01J 20/041* (2013.01); *B01J 20/043* (2013.01); *B01J 20/06* (2013.01); *B01J 20/18* (2013.01); *B01J 20/2803* (2013.01); *B01J 20/28004* (2013.01); *B01J 20/2805* (2013.01); *B01J 20/2808* (2013.01); *B01J 20/28016* (2013.01); *B01J 20/28064* (2013.01); *H01L 31/186* (2013.01); *H01L 33/56* (2013.01); *H01L 51/5259* (2013.01)

(58) Field of Classification Search
CPC ... H01L 23/26; H01L 51/5259; H01L 31/186; H01L 27/15–156; H01L 2933/00–0091; H01L 51/50–56; H01L 51/0032–0095; H01L 27/32–3297; H01L 2251/50–568; H01L 33/48–56; H01L 51/52–5296; H01L 2933/0033; B32B 2457/206
See application file for complete search history.

(56) References Cited

U.S. PATENT DOCUMENTS

| | | |
|---|---|---|
| 5,696,785 A | 12/1997 | Bartholomew et al. |
| 2004/0127358 A1 | 7/2004 | Derosa et al. |
| 2005/0162067 A1 | 7/2005 | Shiraga et al. |
| 2005/0230691 A1 | 10/2005 | Amiotti et al. |
| 2008/0272333 A1 | 11/2008 | Blanco-Garcia et al. |
| 2016/0359139 A1* | 12/2016 | Shintani .............. H01L 51/5253 |

FOREIGN PATENT DOCUMENTS

| | | |
|---|---|---|
| EP | 0 707 360 A1 | 4/1996 |
| JP | 2000-113976 A | 4/2000 |
| WO | WO 2006/064289 A1 | 6/2006 |

OTHER PUBLICATIONS

International Search Report dated May 2, 2017, in PCT/IB2017/050812 filed Feb. 14, 2017.
Written Opinion of the International Searching Authority dated May 2, 2017, in PCT/IB2017/050812 filed Feb. 14, 2017.
Written Opinion of the International Searching Authority dated Feb. 14, 2018, in PCT/IB2017/050812 filed Feb. 14, 2017.
International Preliminary Report on Patentability dated May 4, 2018, in PCT/IB2017/050812 filed Feb. 14, 2017.

* cited by examiner

*Primary Examiner* — Scott B Geyer
(74) *Attorney, Agent, or Firm* — Oblon, McClelland, Maier & Neustadt, L.L.P.

(57) ABSTRACT

LED system comprising a sealed internal volume containing one or more elements sensitive to the presence of Volatile Organic Compounds (VOCs), wherein in said internal volume is present a getter composition for VOCs removal comprising a combination of at least two different types of zeolite.

16 Claims, No Drawings

LED SYSTEM

The present invention is inherent to LED systems containing a getter composition for Volatile Organic Compounds (VOCs) removal.

It is known that a LED is an optoelectronic device that exploits the optical properties of some semiconductor materials to generate photons by means of electron-holes recombination. Electrons and holes are injected into a recombination zone from two regions, one containing an n-type dopant for the electrons, the other one containing a p-type dopant for the holes, in order to achieve a so called p-n junction.

LED light emission is determined and defined by the semiconductor material and/or by one or more luminescent materials (phosphors), each emitting in a well-defined region of the visible spectrum, different colors being achieved by proper combinations of said materials. For example, white light can be obtained by combining a red LED, a green LED and a blue LED, or a single blue/UV LED could be used to excite adjacent phosphors re-emitting light at longer wavelengths, in such a way that a single LED with phosphors can have and exhibit a proper color spectrum, such as yellow or yellow and red that combined with the blue emission from the LED gives white light.

Essentially a LED consists in a thin sheet of semiconductor material (often called and referred to as "die"), over which the phosphors are distributed, the thin sheet being connected to an appropriate structure for the power supply and the thermal dissipation.

The die is then protected by a polymeric encapsulant, and this system is commonly known as a LED package.

For the purposes of the present invention the term LED system encompasses both simple LED packages mounted over traditional substrates and encapsulated with polymeric resins, and also illumination devices made up of LED packages and additional components, such as heat sinks, reflectors, diffusers, bulbs or external envelopes.

A common feature of these LED systems is this hermetic sealing, i.e. the systems do not have direct opening or passages with the external environment, differently from what disclosed in the International patent application WO 2016/181293 filed in the applicant's name.

LED systems exhibit enhanced luminous emissions and a longer operational life with respect to traditional light sources, but could suffer a performance decay and manifest reliability problems due to the presence of volatile organic contaminants, that can be released by the encapsulating materials and/or by other materials such as adhesives (especially epoxy based ones), sealing materials, fillers, soldering pastes, solvent residues, coatings, gaskets. In addition to this internal source of contaminations, VOCs may also enter into the LED system from the external environment through permeation.

In a hermetically sealed LED system there is a relatively high operating temperature, that in the most common systems and configurations ranges between 60° C. and 120° C.

In this operating condition VOCs generated during operation are trapped inside the system or their releasing kinetic is very slow; as a consequence, they diffuse within the sealed LED system causing a color change and transparency loss of the encapsulating materials, leading to a performance degradation in term of luminous flux and to a color shift.

To overcome these problems, LED manufacturers try to avoid to the maximum extent the use of VOCs releasing materials, but this leads to constraints in the LED systems design and manufacturing that can be quite expensive to produce, for example by employing particular types of PCBs (Printed Circuit Boards). Moreover it is not possible to completely avoid penetration and release of these substances over the operating lifetime of the LED, that therefore will encounter a progressive decay, even before its actual use, while kept in stock on a shelf.

More details on the VOCs detrimental effect and degradation mechanism can be found on the application note from Vossloh-Schwabe, "Chemical Incompatibilities affecting LEDS", currently retrievable from the following internet address: https://www.vossloh-schwabe.com/fileadmin/user_upload/Download/Produkte/Chemical_Incompatibility_EN.pdf Solutions for dealing with VOCs contaminants in electronic devices are described in the US patent application 2004/0127358, describing the use of zeolites as suitable materials for harmful organic vapors removal to be used in conjunction with an oxygen scavenger, while international patent application WO 2016/154156 similarly discloses the use of zeolites as suitable materials for the removal of contaminants, including VOCs. Also, the US patent application 2005/0230691 discloses a sealed LED system with an integrated getter containing zeolites for the removal of oxygen, water and other contaminants, although not specifically mentioning VOCs.

Most commonly VOCs contaminants within LED systems are toluene, benzene, xylene, heptene, heptane, dodecane, undecane, their alkyl (e.g. methyl) derivatives, silanols and their alkyl derivatives, ethers, ketons, aldeydes, amines.

Aim of the present invention is to provide a LED system capable to overcome these problems and to provide an improved solution for VOCs removal in LED systems, and in a first aspect thereof it consists in a LED system comprising a sealed internal volume wherein in said internal volume there is present a VOCs oxidation compound or a hydrogen releasing compound, and also a getter composition for Volatile Organic Compounds (VOCs) removal, said getter composition for VOCs removal comprising a zeolite materials combination, wherein one component of said zeolite materials combination is chosen from one or more of Mordenite Framework Inverted (MFI), Faujasite 13X, Mordenite, and said zeolite combination contains Linde type A (LTA) zeolites in an amount comprised between 4 wt. % and 25 wt. %.

Preferably, the different zeolite amounts in said getter composition for VOCs removal are given by the following formula:

$$(MFI)_x + (Faujasite\ 13X)_y + (Mordenite)_z + (LTA)_d$$

wherein indexes x, y, z, d are the wt. % of the zeolite types in the getter composition for VOCs removal, and wherein:

x is comprised between 0 and 80
y is comprised between 0 and 90
z is comprised between 0 and 60
d is comprised between 4 and 25
and x+y+z+d is 100.

It has to be underlined and understood that the above definitions and formula do not exclude the presence of other compounds/materials within the LED inner volume, and therefore those ranges define and address the weight ratio of the LTA zeolite (whose presence is mandatory for the purposes and effects of the present invention) with respect to the other types of zeolites above specified and the weight ratio of the other types of zeolites in the zeolite materials combination.

The inventors have found that a getter material according to the present invention has a higher capacity for VOCs with respect to the generic use of zeolites as described in the US patent application 2004/0127358.

For the purposes of the present invention the zeolites preferably have a surface area higher than 700 m$^2$/g and pore dimensions equal to or higher than 4 Angstroms.

Preferably the average size of the zeolites is lower than 200 μm and even more preferably lower than 100 μm. For non-spherical powders the size refers to the biggest particle dimension and such value is used for the average determination. Also zeolites of sub-micrometric dimension, defined as zeolites having a distribution where 90% of the particles have a size equal or less than 1 μm (X90<1 μm) could be used, even though performances improvement is offset by associated increasing complexity and higher costs.

Preferably the getter composition amount per unit of free internal volume is comprised between 0.04 mg/cm$^3$ and 0.60 mg/cm$^3$, and more preferably comprised between 0.06 mg/cm$^3$ and 0.40 mg/cm$^3$. The free internal volume is defined as the inner volume of the sealed LED system free of components/materials, i.e. the part of the LED system that is kept in vacuum or filled with a suitable gas or gas mixture.

As described in the international patent application WO 2015/053706, it may be useful to insert in a LED system a VOCs oxidation compound to be used in conjunction with the getter solution of the present invention.

Two mechanisms could be exploited to have VOCs oxidation by means of a suitable material. In one case a VOCs oxidation compound is an oxygen dispenser, and VOCs are oxidized also due to the high temperature within the LED system. In this case preferred oxygen releasing compositions are chosen from one or more of $MgO_2$, $Mg_xZn_yO_2$ (where the sum of x+y=1), $CaO_2$, $ZnO_2$, $Li_2O_2$, $Na_2CO_3:1.5H_2O_2$, $NaBO_3:nH_2O$, $KMnO_4$, $Ca(MnO_4)_2$.

The other VOCs oxidation mechanism envisions the use of an oxide promoting the VOCs reaction on the surface of the material itself. In this case preferred oxidizing materials are CuO, ZnO, MgO, $Li_2O$, $TiO_2$, $MnO_2$, PdO. In both cases the amount of the VOCs oxidation compound is usefully comprised between 0.05 mg/cm$^3$ and 2.0 mg/cm$^3$, preferably between 0.15 mg/cm$^3$ and 1.5 mg/cm$^3$ per unit of free internal volume of the LED system.

Since the reaction of the VOCs with the additional oxidation compound, being it an oxygen dispenser or an oxide with a surface reaction mechanism, will generate water, usefully an amount of CaO comprised between 0.03 mg/cm$^3$ and 1.5 mg/cm$^3$ is also present.

In an alternate embodiment, the getter system according to the present invention is used with a hydrogen releasing material. Said hydrogen releasing material is present in an amount comprised between 0.05 mg/cm$^3$ and 1.0 mg/cm$^3$ per unit of free internal volume, and preferably chosen from LiH, NaH, $MgH_2$, $CaH_2$, $LiAlH_4$, $LiBH_4$, $NaAlH_4$, $TiH_2$, $ZrH_4$, $YH_2$, $ZrCr_{(2-x)}Mn_{(x)}H_2$, (where x is comprised between 0 and 2) $LaNi_{(5-y)}AlyH_{(6+z)}$, $LaNi_{(5-y)}SnyH_{(6+z)}$, (where y is comprised between 0 and 0.25 and z is comprised between 0 and 0.5) and their sub-stoichiometric compounds This type of solution is advantageous to improve the thermal dissipation of the LED system in view of the high thermal conductivity of hydrogen that can be emitted from the hydrogen releasing material. It has to be underlined that this type of solution excludes the concurrent presence of VOCs oxidation compounds. The two solutions, VOCs oxidation compounds or hydrogen releasing compounds, achieve two different effects and are alternatively employed in different situations: in the first case there is a synergistic effect in VOCs removal, useful to take care of possible transients and upsurges in the VOCs generation/permeation in the LED system, while the second solution improves thermal conductivity and is most usefully adopted when the foreseen VOCs generation to take care of is constant or at least below a certain threshold.

It has to be remarked that both these additional materials are optionally present, and a LED system according to the present invention envisions the use of only one of them in addition to a getter composition for VOCs removal, as the main advantage of a LED system according to the present invention is to assure the effective removal of VOCs present within the inner volume of the LED system, preventing lighting performance decay due to color changes and transparency loss.

Another relevant advantage of a LED system according to the present invention is given by the freedom to choose the adopted materials, without the need to take into account complete absence of VOCs or VOCs releasing and VOCs permeating mechanisms over time, so that the system is more reliable, easy and at the same time less expensive to manufacture. In particular in some LED systems specific compounds such as silanols or siloxanes can be released from the used materials and can have detrimental effects on their performances.

For example in LED laser packages, also named laser diode packages, the presence of siloxanes, such as volatile methyl siloxanes, hexamethyldisiloxane, hydroxytrimethylsilane, hexamethylcyclotrisiloxane, octamethylcyclotetrasiloxane, decamethylcyclopentasiloxane, dodecamethylcyclohexasiloxane, and others low molecular weights siloxanes (molecular weight lower than one thousand amu), is undesired and the adoption of getter materials described in the present invention is beneficial for their removal in order to maintain a low level of contamination A suitable configuration for the getter materials is in the form of powders as such compressed within containers. Examples of such configurations are widely known to a person skilled in the art, and can be found for example in the European patents 1851783 and 2408942 both in the applicant's name, and whose teachings are herein incorporated by reference. In an alternate embodiment the getter material powders can be mixed and compressed in the containers with an inorganic material acting as retaining aid in an amount usefully comprised between 20 wt. % and 80 wt. %, the inorganic material being preferably chosen from one or more the following materials: Cu alloys, Sn alloys, kaolinite clays, montmorillonite clays. Another suitable geometrical configuration is the one shown in the U.S. Pat. No. 6,169,361 in this case with reference solely to an oxygen dispensing solution, but such a configuration could be usefully employed also in the present invention.

Alternatively the getter material can be used in the form of stand-alone (or self-standing) compressed powders. In this case preferred shapes are pills or tablets, and also in this case additional details may be found in European patent 2408942. In an alternate embodiment of this configuration, the getter powders are retained by an inorganic matrix present in an amount higher than 50 wt. % and preferably comprised between 60 wt. % and 90 wt. %. Suitable inorganic materials for the retaining matrix are preferably chosen from one or more of Cu alloys, Sn alloys, kaolinite clays, montmorillonite clays.

Another preferred configuration for the getter material is in the form of powders dispersed in a suitable polymeric matrix or contained in a gas-permeable polymeric envelope. Preferred matrixes and polymeric envelope materials are chosen from high density polyethylene (HDPE), low density polyethylene (LDPE), polypropylene (PP), polystyrene (PS), polyethylene terephthalate (PET), polyvinyl chloride (PVC). This type of solution for the getter material configuration is known and described for example in the international patent applications WO 2007/066372 and WO 2008/148781, both in the applicant's name.

Alternatively, the active composition can be applied on a suitable support strip, preferably a metallic strip. In a preferred embodiment the active composition is dispersed in a polymeric matrix, for example in polyesters epoxy resins, epoxy-acrylic resins, acrylic resins, polyurethane resins, siloxane matrices, silicone grease, polyimide, polyamide resins and preferably in a silicone based resin, deposited and adhering on the support, as described in the European Patent 1595930 in the applicant's name.

Generally speaking the present invention encompasses the fact that the powders are used as such, but can be also advantageously used suitably dispersed and bound, by means of a suitable chemical agent (binder) or by means of a suitable consolidation treatment, for example a thermal treatment such as sintering.

The mutually exclusive VOCs oxidation compounds or $H_2$ dispensing materials can be mixed with the getter composition, or can be separately placed in a different portion/region of the LED system.

The present invention is not limited to any specific LED system, in particular there are two major types of LED system devices according to the present invention, the first one consisting in light emitting devices, such as lamps, the second one consisting in light driven devices, such as laser diode systems and packages.

The invention will be further illustrated with the help of the following non limiting examples evaluating the relative performance for toluene sorption of samples consisting in metallic rings containing pressed powder mixtures of the compositions detailed in table 1, where sample S1, $(MFI)_{20}+(Faujasite\ 13X)_{45}+(Mordenite)_{20}\ (LTA)_{15}$, made according to the present invention, is used as reference.

The characterizations tests have been carried out measuring, by means of a microbalance, the sorption capacity for toluene, kept at a constant pressure of 1 mbar and at room temperature, this test was carried out for the samples encompassed by the present invention (S1-53) and for three comparative examples (C1-C3) not encompassed by the present invention.

TABLE 1

Samples compositions and their relative sorption performances with respect to reference sample S1

| Sample ID | MFI wt. % | Faujasite 13X wt. % | Mordenite wt. % | LTA wt. % | Relative capacity with respect to S1 |
|---|---|---|---|---|---|
| S1 | 20 | 45 | 20 | 15 | — |
| S2 | 30 | 35 | 30 | 5 | Comparable |
| S3 | 23 | 40 | 15 | 22 | Comparable |
| C1 | 20 | 35 | 15 | 30 | Inferior |
| C2 | 20 | 35 | 44 | 1 | Inferior |
| C3 | 35 | 15 | 20 | 30 | Substantially inferior |

In table 1 the term comparable indicates a difference in the capacity within ±7.5% with respect to the reference S1, inferior indicates a reduced capacity from 10% to 30% with respect to S1, substantially inferior a reduced capacity equal to or higher than 30% with respect to S1.

It is possible to observe that the compositions according to the present invention S1-S3, have comparable capacity, while all three comparative examples C1-C3, having a LTA zeolite wt. % outside the range of the present invention, C1 and C3 higher, C2 lower, have worsened performances in terms of toluene removal overall capacity.

The invention claimed is:

1. An LED system comprising a sealed internal volume comprising a getter composition for Volatile Organic Compounds (VOCs) removal that comprises a zeolite materials combination comprising Linde type A (LTA) zeolites and at least one zeolite material selected from the group consisting of Mordenite Framework Inverted (MFI), Faujasite 13X, and Mordenite, wherein said Linde type A (LTA) zeolites are present in an amount comprised between 4 wt. % and 25 wt. %, and wherein, in addition to said getter composition for VOCs removal, an oxygen releasing composition is present in said sealed internal volume.

2. The LED system according to claim 1, wherein said getter composition for VOCs removal comprises the zeolite materials in amounts given by the formula:

$$(MFI)_x+(Faujasite\ 13X)_y+(Mordenite)_z+(LTA)_d$$

wherein indexes x, y, z, d are the wt. % of the zeolite types in the getter composition for VOCs removal, and wherein:
x is comprised between 0 and 80;
y is comprised between 0 and 90;
z is comprised between 0 and 60;
d is comprised between 4 and 25; and
x+y+z+d is 100.

3. The LED system according to claim 1, wherein the amount of said getter composition for VOCs removal per unit of free internal volume is comprised between 0.04 mg/cm$^3$ and 0.60 mg/cm$^3$.

4. The LED system according to claim 1, wherein the zeolites in said getter composition for VOCs removal have a surface area greater than 700 m$^2$/g and pore dimension equal to or greater than 4 Angstroms.

5. The LED system according to claim 1, wherein said getter composition for VOCs removal is capable of removing silanols and/or siloxanes.

6. The LED system according to claim 1, wherein said oxygen releasing composition is at least one selected from the group consisting: of $MgO_2$; $Mg_xZn_yO_2$, where the sum of x+y=1; $CaO_2$; $ZnO_2$; $Li_2O_2$; $Na_2CO_3 \cdot 1.5H_2O_2$; $NaBO_3$:$nH_2O$; $KMnO_4$; and $Ca(MnO_4)_2$.

7. The LED system according to claim 1, wherein the amount of said oxygen releasing composition per unit of free internal volume is comprised between 0.05 mg/cm$^3$ and 2.0 mg/cm$^3$.

8. The LED system according to claim 1, further comprising CaO in an amount comprised between 0.03 mg/cm$^3$ and 1.5 mg/cm$^3$ per unit of free internal volume.

9. The LED system according to claim 1, wherein said getter composition for VOCs removal is in the form of powders having an average particle size less than 200 μm.

10. The LED system according to claim 1, wherein said getter composition for VOCs removal is in the form of powders, and said powders are alternatively:
pressed in a container, optionally comprising a retaining inorganic aid in an amount comprised between 20 wt. % and 80 wt. %; or
compressed in the form of stand-alone pills or tablets, optionally comprising a retaining inorganic aid in an amount comprised between 20 wt. % and 80 wt. %; or retained by an inorganic matrix, wherein the amount of said inorganic matrix is greater than 50 wt. %; or contained within a gas-permeable polymeric envelope; or dispersed within an organic matrix.

11. The LED system according to claim 10, wherein said getter composition for VOCs removal is mixed with said oxygen releasing composition, and wherein said oxygen releasing composition is at least one selected from the group consisting: of $MgO_2$; $Mg_xZn_yO_2$, where the sum of x+y=1; $CaO_2$; $ZnO_2$; $Li_2O_2$; $Na_2CO_3$: $1.5H_2O_2$; $NaBO_3$:$nH_2O$; $KMnO_4$; and $Ca(MnO_4)_2$.

12. The LED system according to claim 1, wherein said LED system is a light emitting device or a light driven device.

13. The LED system according to claim 1, wherein the amount of said getter composition for VOCs removal per unit of free internal volume is comprised between 0.06 mg/cm$^3$ and 0.40 mg/cm$^3$.

14. The LED system according to claim 1, wherein the amount of said oxygen releasing composition per unit of free internal volume is comprised between 0.15 mg/cm$^3$ and 1.50 mg/cm$^3$.

15. The LED system according to claim 1, wherein said getter composition for VOCs removal is in the form of powders having an average particle size less than 100 μm.

16. The LED system according to claim 1, wherein said getter composition for VOCs removal is in the form of powders, and said powders are alternatively:

pressed in a container, optionally comprising a retaining inorganic aid in an amount comprised between 20 wt. % and 80 wt. %, wherein the retaining inorganic aid is at least one selected from the group consisting of a Cu alloy, an Sn alloy, kaolinite, and a montmorillonite clay; or compressed in the form of stand-alone pills or tablets, optionally comprising a retaining inorganic aid in an amount comprised between 20 wt. % and 80 wt. %, wherein the retaining inorganic aid is at least one selected from the group consisting of a Cu alloy, an Sn alloy, kaolinite, and a montmorillonite clay; or retained by an inorganic matrix, wherein the amount of said inorganic matrix is comprised between 60 wt. % and 90 wt. % and said inorganic matrix is at least one selected from the group consisting of a Cu alloy, an Sn alloy, kaolinite, and a montmorillonite clay; or contained within a gas-permeable polymeric envelope, said envelope being made of at least one selected from the group consisting of high density polyethylene (HDPE), low density polyethylene (LDPE), polypropylene (PP), polystyrene (PS), polyethylene terephthalate (PET), and polyvinyl chloride (PVC); or dispersed within an organic matrix selected from the group consisting of polyester epoxy resins, epoxy-acrylic resins, acrylic resins, polyurethane resins, siloxane matrices, silicone grease, polyimide, polyamide resins, and silicone based resins.

\* \* \* \* \*